United States Patent
Ko et al.

(10) Patent No.: US 8,816,391 B2
(45) Date of Patent: Aug. 26, 2014

(54) SOURCE/DRAIN ENGINEERING OF DEVICES WITH HIGH-MOBILITY CHANNELS

(75) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 12/615,996

(22) Filed: Nov. 10, 2009

(65) Prior Publication Data

US 2010/0252862 A1    Oct. 7, 2010

Related U.S. Application Data

(60) Provisional application No. 61/183,403, filed on Jun. 2, 2009, provisional application No. 61/182,961, filed on Jun. 1, 2009, provisional application No. 61/182,550, filed on May 29, 2009, provisional application No. 61/165,803, filed on Apr. 1, 2009.

(51) Int. Cl.
*H01L 29/772* (2006.01)

(52) U.S. Cl.
USPC ............... 257/192; 257/256; 257/E29.081; 257/E29.246

(58) Field of Classification Search
USPC .......... 257/192, 407, 411, E29.081, E29.246; 438/603, 604, 605
See application file for complete search history.

(56) References Cited

U.S. PATENT DOCUMENTS

| | | |
|---|---|---|
| 5,621,227 A | 4/1997 | Joshi |
| 6,121,153 A | 9/2000 | Kikkawa |
| 6,218,685 B1 | 4/2001 | Nogome |
| 6,399,970 B2 | 6/2002 | Kubo et al. |
| 6,475,869 B1 | 11/2002 | Yu |
| 6,475,890 B1 | 11/2002 | Yu |
| 6,512,252 B1 | 1/2003 | Takagi et al. |
| 6,635,909 B2 | 10/2003 | Clark et al. |
| 6,706,571 B1 | 3/2004 | Yu et al. |
| 6,762,483 B1 | 7/2004 | Krivokapic et al. |
| 6,858,478 B2 | 2/2005 | Chau et al. |

(Continued)

FOREIGN PATENT DOCUMENTS

| | | |
|---|---|---|
| AU | 2003 223306 A1 | 10/2003 |
| CN | 1289149 A | 3/2001 |

(Continued)

OTHER PUBLICATIONS

Chuang, R.W., et al., "Gallium nitride metal-semiconductor-metal photodetectors prepared on silicon substrates," Journal of Applied Physics, vol. 102, 2007, pp. 073110-1-073110-4.

(Continued)

*Primary Examiner* — Marc Armand
(74) *Attorney, Agent, or Firm* — Slater and Matsil, L.L.P.

(57) ABSTRACT

An integrated circuit structure includes a substrate, and a channel over the substrate. The channel includes a first III-V compound semiconductor material formed of group III and group V elements. A gate structure is over the channel. A source/drain region is adjacent the channel and includes a group-IV region formed of a doped group-IV semiconductor material selected from the group consisting essentially of silicon, germanium, and combinations thereof.

19 Claims, 14 Drawing Sheets

(56) References Cited

U.S. PATENT DOCUMENTS

| | | |
|---|---|---|
| 6,921,963 B2 | 7/2005 | Krivokapic et al. |
| 6,960,781 B2 | 11/2005 | Currie et al. |
| 7,042,009 B2 | 5/2006 | Shaheen et al. |
| 7,045,401 B2 | 5/2006 | Lee et al. |
| 7,154,118 B2 | 12/2006 | Lindert et al. |
| 7,190,050 B2 | 3/2007 | King et al. |
| 7,205,615 B2 | 4/2007 | Tsutsui et al. |
| 7,247,887 B2 | 7/2007 | King et al. |
| 7,265,008 B2 | 9/2007 | King et al. |
| 7,382,021 B2 * | 6/2008 | Faulkner et al. ............. 257/344 |
| 7,508,031 B2 | 3/2009 | Liu et al. |
| 7,528,465 B2 | 5/2009 | King et al. |
| 7,560,784 B2 | 7/2009 | Cheng et al. |
| 7,598,134 B2 | 10/2009 | Mouli |
| 7,605,449 B2 | 10/2009 | Liu et al. |
| 7,683,436 B2 | 3/2010 | Nishiyama et al. |
| 7,768,079 B2 | 8/2010 | Sandford et al. |
| 7,928,426 B2 | 4/2011 | Chui et al. |
| 7,936,040 B2 * | 5/2011 | Wu ............................. 257/474 |
| 7,956,383 B2 | 6/2011 | Kuroda et al. |
| 7,989,280 B2 | 8/2011 | Brask et al. |
| 8,058,692 B2 | 11/2011 | Lai et al. |
| 8,076,231 B2 | 12/2011 | Saitoh et al. |
| 8,174,073 B2 | 5/2012 | Lee et al. |
| 8,237,153 B2 | 8/2012 | Chui et al. |
| 8,314,652 B2 | 11/2012 | Kuo et al. |
| 8,357,927 B2 | 1/2013 | Jang |
| 8,399,926 B2 | 3/2013 | Saitoh et al. |
| 8,455,860 B2 | 6/2013 | Ko et al. |
| 2004/0173812 A1 | 9/2004 | Currie et al. |
| 2004/0197975 A1 | 10/2004 | Krivokapic et al. |
| 2004/0251479 A1 | 12/2004 | Tsutsui et al. |
| 2005/0093154 A1 | 5/2005 | Kottantharayil et al. |
| 2005/0104137 A1 * | 5/2005 | Faulkner et al. ............. 257/407 |
| 2005/0153490 A1 | 7/2005 | Yoon et al. |
| 2005/0186742 A1 | 8/2005 | Oh et al. |
| 2006/0057856 A1 | 3/2006 | Senda et al. |
| 2006/0076625 A1 | 4/2006 | Lee et al. |
| 2006/0148182 A1 | 7/2006 | Datta et al. |
| 2006/0292719 A1 | 12/2006 | Lochtefeld et al. |
| 2007/0102763 A1 | 5/2007 | Yeo et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0238281 A1 | 10/2007 | Hudait et al. |
| 2007/0243703 A1 | 10/2007 | Pinnington et al. |
| 2007/0262353 A1 | 11/2007 | Nishiyama et al. |
| 2008/0169485 A1 | 7/2008 | Heyns et al. |
| 2008/0185691 A1 | 8/2008 | Cheng et al. |
| 2008/0237577 A1 | 10/2008 | Chui et al. |
| 2008/0237655 A1 | 10/2008 | Nakabayashi et al. |
| 2008/0258243 A1 | 10/2008 | Kuroda et al. |
| 2008/0290470 A1 | 11/2008 | King et al. |
| 2008/0296632 A1 | 12/2008 | Moroz et al. |
| 2008/0315310 A1 | 12/2008 | Rachmady et al. |
| 2009/0001415 A1 | 1/2009 | Lindert et al. |
| 2009/0079014 A1 | 3/2009 | Sandford et al. |
| 2009/0095984 A1 | 4/2009 | Brask et al. |
| 2009/0181477 A1 | 7/2009 | King et al. |
| 2009/0194790 A1 | 8/2009 | Sato et al. |
| 2009/0242990 A1 | 10/2009 | Saitoh et al. |
| 2009/0272965 A1 | 11/2009 | Rachmady et al. |
| 2010/0102298 A1 | 4/2010 | Wu |
| 2010/0252816 A1 | 10/2010 | Ko et al. |
| 2010/0252862 A1 | 10/2010 | Ko et al. |
| 2010/0276668 A1 | 11/2010 | Ko et al. |
| 2010/0301390 A1 | 12/2010 | Ko et al. |
| 2010/0301392 A1 | 12/2010 | Ko et al. |
| 2012/0001239 A1 | 1/2012 | Ko et al. |
| 2012/0037994 A1 | 2/2012 | Saitoh et al. |

FOREIGN PATENT DOCUMENTS

| | | | |
|---|---|---|---|
| CN | 1574399 A | 2/2005 | |
| EP | 0921575 A2 | 6/1999 | |
| EP | 1488462 B1 | 2/2011 | |
| JP | 2005-005646 * | 1/2005 | ............ 438/123 |
| JP | 2005 019970 A | 1/2005 | |
| JP | 2005005633 A | 1/2005 | |
| JP | 2005-051241 A | 2/2005 | |
| JP | 2005 062219 A | 3/2005 | |
| JP | 2005 521258 A | 7/2005 | |
| JP | 2006 516820 A | 7/2006 | |
| JP | 2006 521026 A | 9/2006 | |
| JP | 2008 508725 A | 3/2008 | |
| JP | 2008 141040 A | 6/2008 | |
| JP | 2005-060131 A | 7/2008 | |
| JP | 2008 270521 A | 11/2008 | |
| JP | 2008 546181 A | 12/2008 | |
| JP | 2009-105163 A | 5/2009 | |
| KR | 20047012876 | 11/2004 | |
| KR | 20070088817 A | 8/2007 | |
| TW | 580771 B | 3/2004 | |
| TW | I269358 | 12/2006 | |
| WO | WO 03081640 A2 | 10/2003 | |
| WO | WO 2007 046150 A1 | 4/2007 | |

OTHER PUBLICATIONS

Chui, C.O., et al., "Germanium $n$-type shallow junction activation dependences," Applied Physics Letters, vol. 87, 2005, pp. 091909-1-091909-3.

Datta, S., et al., "Ultrahigh-Speed 0.5 V Supply Voltage In$_{0.7}$Ga$_{0.3}$As Quantum-Well Transistors on Silicon Substrate," IEEE Electron Device Letters, vol. 28, No. 8, Aug. 2007, pp. 685-687.

Iwakami, S., et al., "AlGaN/GaN Heterostructure Field-Effect Transistors (HFETs) on Si Substrates for Large-Current Operation," Japanese Journal of Applied Physics, vol. 43, No. 7A, 2004, pp. L831-L833.

Jackson, S.L., et al., "Silicon Doping of InP, GaAs, In$_{0.53}$Ga$_{0.47}$As and In$_{0.49}$Ga$_{0.51}$P Grown by Gas Source and Metalorganic Molecular Beam Epitaxy Using a SiBr$_4$ Vapor Source," IEEE, Conference Proceedings, Sixth International Conference on Indium Phosphide and Related Materials, Mar. 27-31, 1994, pp. 57-60.

Krishnamohan, T., et al., "High-Mobility Low Band-To-Band-Tunneling Strained-Germanium Double-Gate Heterostructure FETs: Simulations," IEEE Transactions on Electron Devices, vol. 53, No. 5, May 2006, pp. 1000-1009.

Posselt, M., et al., "P implantation into preamorphized germanium and subsequent annealing: Solid phase epitaxial regrowth, P diffusion, and activation," Journal of Vacuum Science Technology, vol. 26, Jan./Feb. 2008, pp. 430-434.

Satta, A., et al., "Diffusion, activation, and regrowth behavior of high dose P implants in Ge," Applied Physics Letters, vol. 88, 2006, pp. 162118-1-162118-3.

Satta, A., et al., "P implantation doping of Ge: Diffusion, activation, and recrystallization," Journal of Vacuum Science Technology, vol. 24, Jan./Feb. 2006, pp. 494-498.

Shih, C.-F., et al., "Blue, Green, and White InGaN Light-Emitting Diodes Grown on Si," Japanese Journal of Applied Physics, vol. 44, No. 4, 2005, pp. L140-L143.

Vanamu, G., et al., "Growth of high-quality GaAs on Ge/Si$_{1-x}$Ge$_x$ on nanostructured silicon substrates," Applied Physics Letters, vol. 88, 2006, pp. 251909-1-251909-3.

Vurgaftman, I., et al., "Band parameters for III-V compound semiconductors and their alloys," Journal of Applied Physics, vol. 89, No. 11, Jun. 1, 2001, pp. 5815-5875.

Yamane, Y., et al., "Selective Formation of Ohmic Contacts to $n$-GaAs," IEEE, Electronics Letters, vol. 23, No. 8, Apr. 9, 1987, pp. 382-383.

* cited by examiner

SOURCE/DRAIN ENGINEERING OF DEVICES WITH HIGH-MOBILITY CHANNELS

This application claims the benefit of U.S. Provisional Application No. 61/183,403 filed on Jun. 2, 2009, entitled "Source/Drain Engineering of Devices with High-Mobility Channels," which application is hereby incorporated herein by reference.

CROSS-REFERENCES TO RELATED APPLICATIONS

This application relates to the following U.S. Patent Applications: Application Ser. No. 61/182,961, filed Jun. 1, 2009, and entitled "Source/Drain Re-Growth for Manufacturing III-V Based Transistors;" Application Ser. No. 61/182,550, filed May 29, 2009, and entitled "Gradient Ternary or Quaternary Multiple-Gate Transistor," and Application Ser. No. 61/165,803, filed Apr. 1, 2009, and entitled "High-Mobility Multiple-Gate Transistor with Improved On-to-Off Current Ratio," which applications are hereby incorporated herein by reference.

TECHNICAL FIELD

This invention relates generally to integrated circuit structures, and more particularly to transistors comprising III-V compound semiconductors and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (commonly known as III-V compound semiconductor) are good candidates for forming NMOS transistors for their high electron mobility. Therefore, III-V compound semiconductors were used to form NMOS transistors. To reduce the manufacturing cost, methods for forming PMOS transistors using III-V compound semiconductors are explored. FIG. 1 illustrates a conventional transistor incorporating III-V compound semiconductors. In the formation process, a plurality of layers is blanket formed on a silicon substrate, wherein the plurality of layers includes a buffer layer formed of GaAs, a graded buffer formed of $In_xAl_{1-x}As$ (with x between, but not equal to, 0 and 1), a bottom barrier formed of $In_{0.52}Al_{0.48}As$, a channel formed of $In_{0.7}Ga_{0.3}As$, a top barrier formed of $In_{0.52}Al_{0.48}As$, an etch stop layer formed of InP, and a contact layer formed of $In_{0.53}Ga_{0.47}As$. A first etch is performed to etch through the contact layer and stopping at the etch stop layer to form a first recess. A second etch is then performed to etch through the etch stop layer and etch into a portion of the top barrier to form a second recess. A gate, which is formed of metal, is then formed in the second recess. The resulting transistor has the advantageous features resulting from the quantum well being formed of the bottom barrier, the channel, and the top barrier.

The above-described transistor, however, suffers drawbacks. It is difficult to dope impurities into III-V compound semiconductors to a high impurity concentration. For example, GaAs may be implanted or in-situ doped with silicon as an impurity, while the maximum doping concentration of silicon is only between about $10^{17}/cm^3$ and about $10^{18}/cm^3$. In addition, the effective density of states in the conduction band of GaAs is only about $4.7 \times 10^{17}/cm^3$. The low density of states in the conduction band results in a high source/drain resistance, which in turn prevents the further improvement in the drive current of the resulting transistor. A method and structure for overcoming the above-described shortcomings in the prior art are thus needed.

SUMMARY OF THE INVENTION

In accordance with one aspect of the present invention, an integrated circuit structure includes a substrate; and a channel over the substrate. The channel includes a first III-V compound semiconductor material formed of group III and group V elements. A gate structure is over the channel. A source/drain region is adjacent the channel and includes a group-IV region formed of a doped group-IV semiconductor material selected from the group consisting essentially of silicon, germanium, and combinations thereof.

Other embodiments are also disclosed.

The advantageous features of the present invention include reduced source/drain resistances and improved drive currents of the resulting transistors. Further, the junction leakage of the transistors is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

Novel transistors comprising compound semiconductor materials of group III and group V elements (referred to as III-V compound semiconductors hereinafter) and the methods of forming the same are provided. The intermediate stages in the manufacturing of embodiments of the present invention are illustrated. The variations of the embodiments are discussed. Throughout the various views and illustrative embodiments of the present invention, like reference numbers are used to designate like elements.

Figure 1:
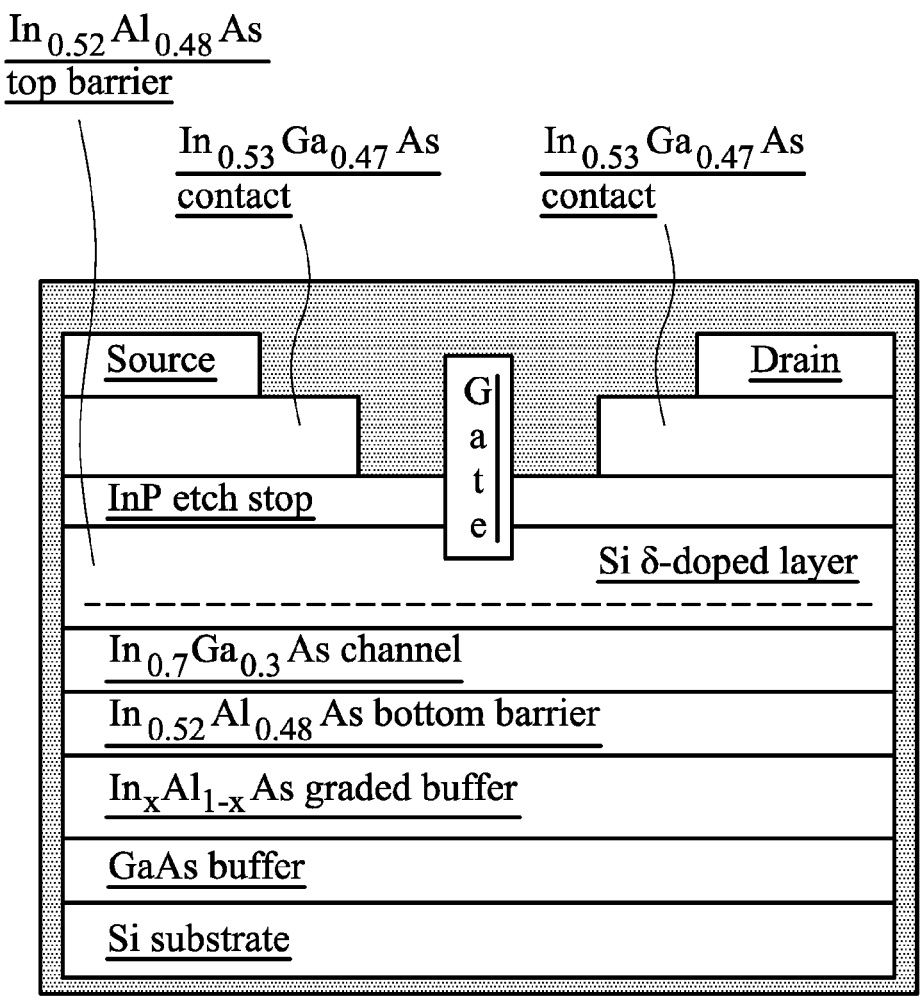
FIG. 1 illustrates a conventional transistor comprising III-V compound semiconductor materials of group III and group V elements.
Figure 2:
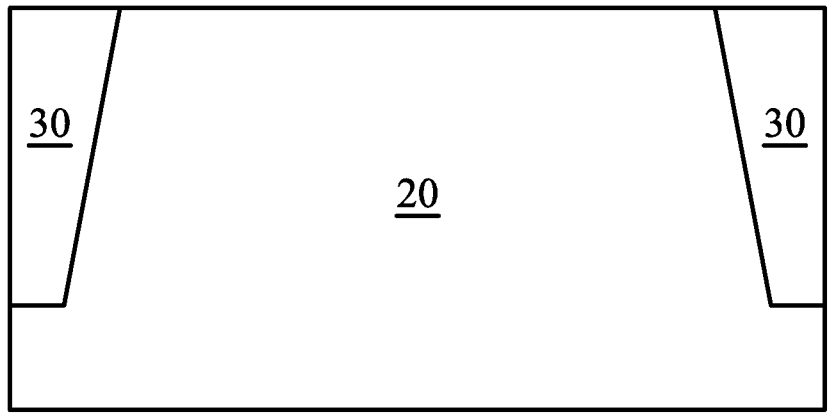
FIGS. 2 through 11 are cross-sectional views of intermediate stages in the manufacturing of a transistor in accordance with an embodiment.

Referring to FIG. 2, substrate 20 is provided. Substrate 20 may be a semiconductor substrate formed of silicon, germanium, SiGe, and/or other semiconductor materials. Insulation structures such as shallow trench isolation (STI) regions 30 are formed in substrate 20.

Figure 3:
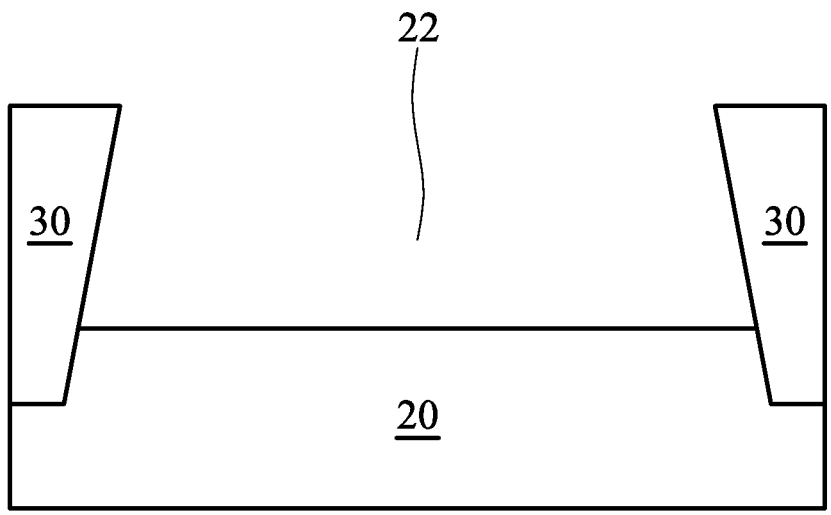
Figure 4A:
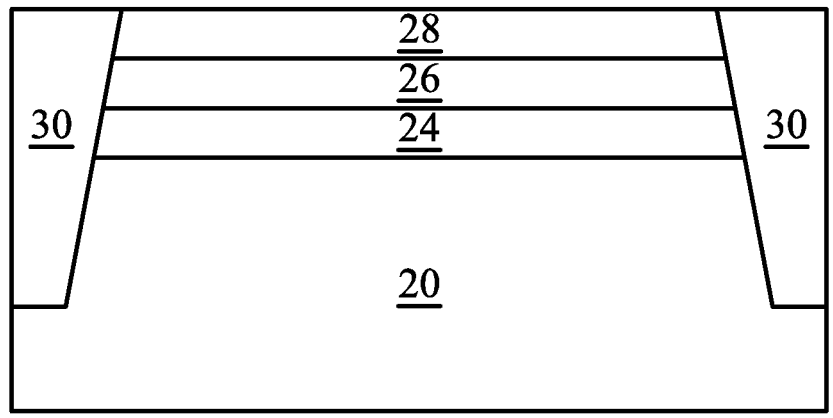

Referring to FIG. 3, recess 22 is formed by etching the portion of substrate 20 between opposite sidewalls of STI regions 30. Next, as shown in FIG. 4A, a plurality of layers includes bottom barrier 24, channel layer 26, and top barrier 28 is epitaxially grown in recess 22. In an exemplary embodiment, channel layer 26 has a first bandgap, while bottom barrier 24 and top barrier 28 have second bandgaps greater than the first bandgap. Accordingly, layers 24, 26, and 28 form a quantum well. The second bandgaps may be greater than the first bandgap by greater than about 0.1 eV, although greater or lower bandgap differences may also apply. The appropriate materials of channel layer 26, top barrier 28 and bottom barrier 24 may be selected by comparing the bandgaps of the available semiconductor materials with high carrier mobilities, which may include, but are not limited to, silicon, germanium, GaAs, InP, GaN, InGaAs, InAs, InSb, InAlAs, GaSb, AlSb, AlAs, AlP, GaP, and combinations thereof. Channel layer 26 may be formed of a III-V compound semiconductor material formed of group III and group V elements. In an exemplary embodiment, channel layer 26 comprises $In_{0.7}Ga_{0.3}As$, while bottom barrier 24 and top barrier 28 comprise $In_{0.52}Al_{0.48}As$. In other embodiments, channel layer 26 comprises InGaAs, while bottom barrier 24 and top barrier 28 are formed of GaAs. In yet other embodiments, channel layer 26 is formed of InAs, while bottom barrier 24 and top barrier 28 comprise InAlAs. Bottom barrier 24 may have a thickness between about 5 nm and about 10000 nm, channel layer 26 may have a thickness between about 2 nm and about 50 nm, and top barrier 28 may have a thickness between about 5 nm and about 500 nm. It is realized, however, that the dimensions recited throughout the description are merely examples, and may be changed if different formation technologies are used.

Optionally, additional buffer layer(s) may be formed over substrate 20 and under an overlying semiconductor layer such as bottom barrier 24. The buffer layer may have a lattice constant between the lattice constant of substrate 20 and the lattice constant of the overlying semiconductor layer, so that the transition of lattice constants from lower layers to upper layers is less abrupt. By forming layers 24, 26, and 28 from between STI regions 30, significantly fewer defects are generated in the re-grown layers.

Figure 4B:
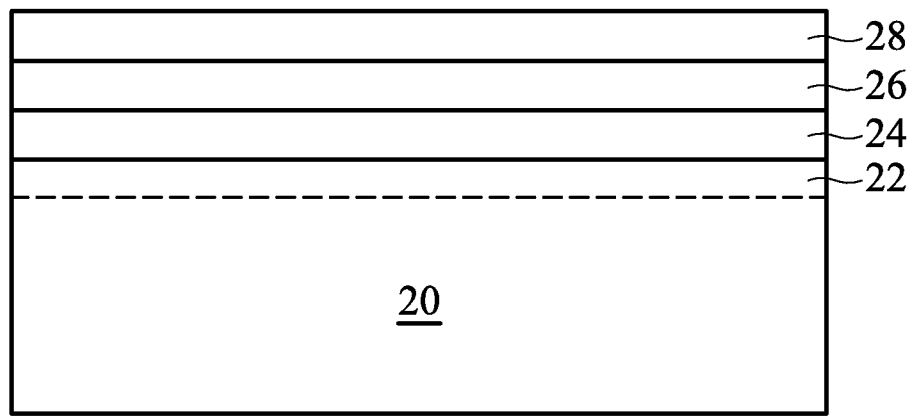

FIG. 4B illustrates an alternative embodiment, wherein layers 24, 26, and 28 are formed as blanket layers on semiconductor substrate 20.

Figure 5:
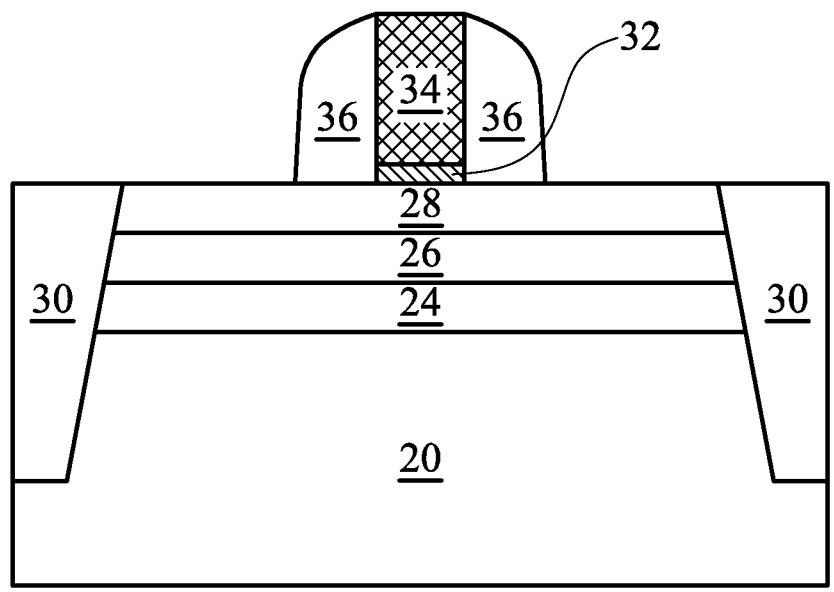

FIG. 5 illustrates the formation of a gate structure and gate spacers 36. The gate structure includes gate dielectric 32 and gate electrode 34. Gate dielectric 32 may be formed of commonly used dielectric materials such as silicon oxide, silicon nitride, oxynitrides, multi-layers thereof, and combinations thereof. Gate dielectric 32 may also be formed of high-k dielectric materials. The exemplary high-k materials may have k values greater than about 4.0, or even greater than about 7.0, and may include aluminum oxide, hafnium oxide, hafnium oxynitride, hafnium silicate, zirconium silicate, yttrium oxide, cerium oxide, titanium oxide, tantalum oxide, and combinations thereof. Gate electrode 34 may be formed of doped polysilicon, metals, metal nitrides, metal silicides, and the like. Gate spacers 36 may be formed of silicon oxide, silicon nitride, and composite layers thereof. The formation processes of gate dielectric 32, gate electrode 34, and gate spacers 36 are known in the art and hence are not described in detail herein.

Figure 6:
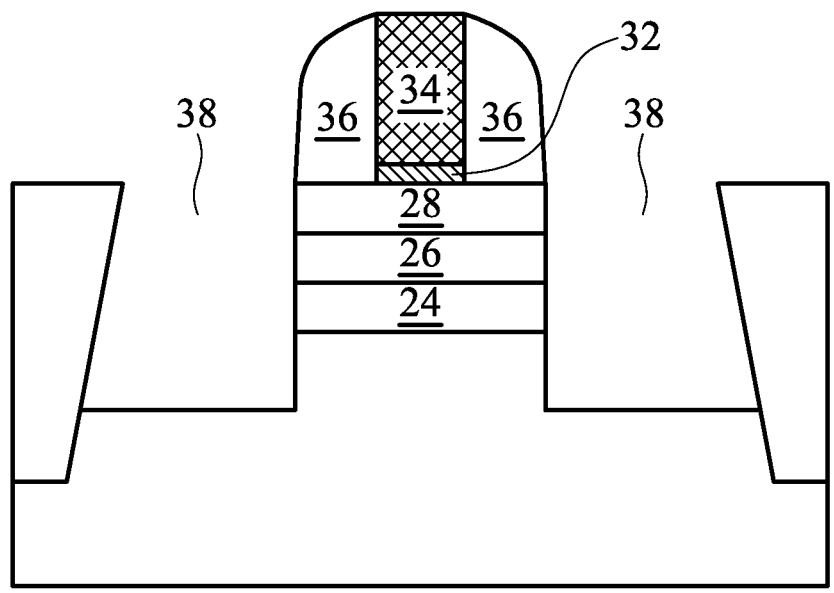

Referring to FIG. 6, recesses 38 are formed. In an exemplary embodiment, a dry etching is used, and hence the sidewalls of recesses 38 are vertically aligned to outer edges of gate spacers 36. As an example, while the sidewalls of recesses 38 and the outer edges of gate spacers 36 are described herein as being vertically aligned, those skilled in the art will recognize that this limitation is intended to cover the misalignment caused by process variations and by process optimization. The bottom surfaces of recesses 38 may be lower than the bottom surface of channel layer 26.

Figure 7A:
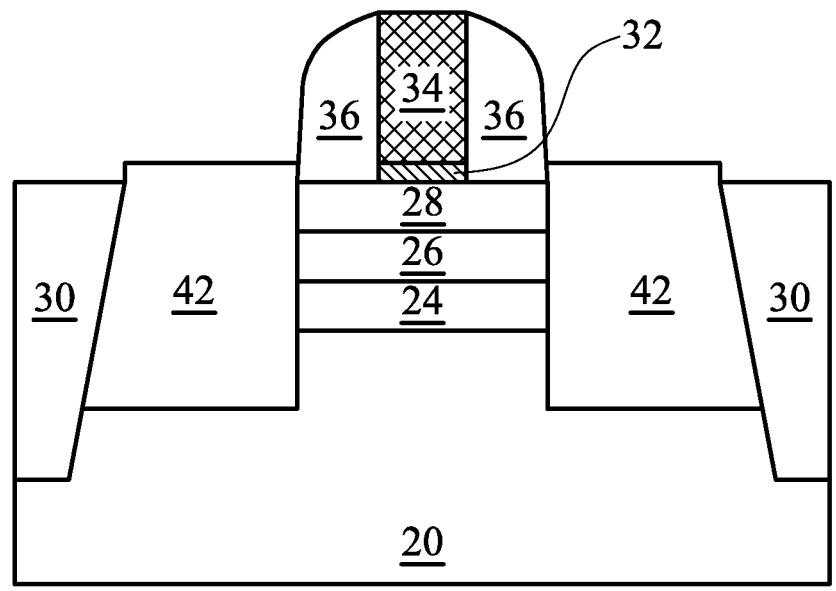

Referring to FIG. 7A, a group-IV semiconductor material is epitaxially grown in recesses 38, forming source and drain regions 42 (referred to as source/drain regions hereinafter). In an embodiment, source/drain regions 42 may be formed of silicon, germanium, or silicon germanium (SiGe). If the resulting transistor is intended to be an NMOS transistor, source/drain regions 42 may be doped with an n-type impurity, such as phosphorous, arsenic, antimony, and combinations thereof. If the resulting transistor is intended to be a PMOS transistor, source/drain regions 42 may be doped with a p-type impurity, such as boron, indium, and combinations thereof. The n-type impurity or the p-type impurity may be in-situ doped with the proceeding of the epitaxial growth of source/drain regions 42, or may be performed by implantation after the epitaxial growth of source/drain regions 42. The doping concentration of the p-type or n-type impurity may be between about $1 \times 10^{18}/cm^3$ and about $1 \times 10^{21}/cm^3$. In this embodiment, source/drain regions 42 are also referred to as group-IV semiconductor regions 46.

Figure 7B:
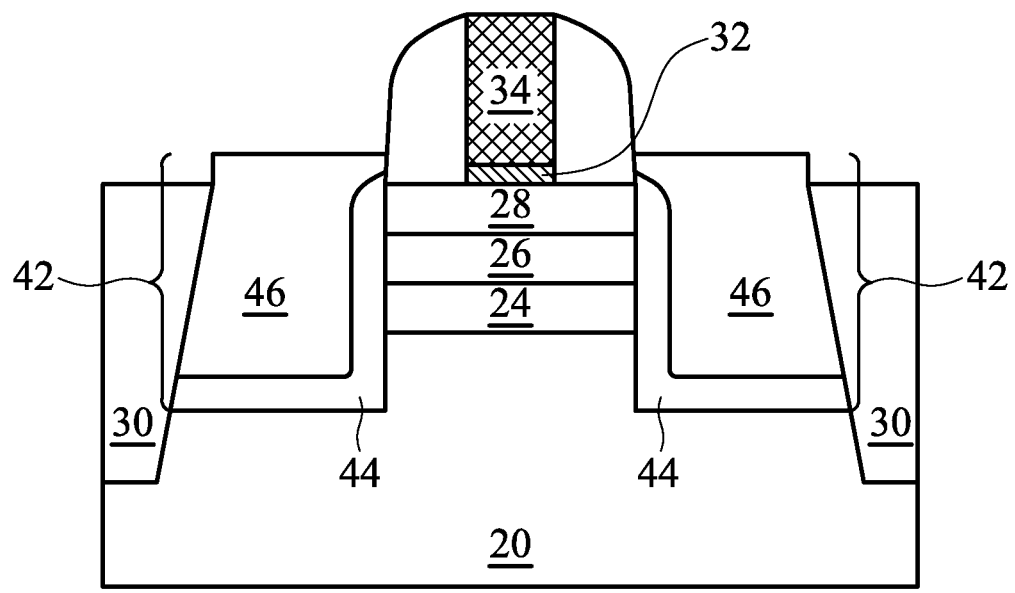

FIG. 7B illustrates an alternative embodiment, wherein the epitaxial growth of source/drain regions 42 includes the epitaxial growth of III-V compound semiconductor regions 44 (referred to as buffer layers hereinafter), and group-IV semiconductor regions 46 on buffer layers 44. Buffer layers 44 may be formed of a III-V compound semiconductor material, which may include, but is not limited to, GaAs, InP, GaN, InGaAs, InAlAs, GaSb, AlSb, AlAs, AlP, GaP, combinations thereof, and multi-layers thereof. Buffer layers 44 may have a horizontal portion on the bottom of recesses 38 (FIG. 6) and vertical portions on the sidewalls of recesses 38. In an embodiment, buffer layers 44 include a gradient composition, with the compositions of lower portions gradually changing to the desirable composition of upper portions. Also, the lower portions of buffer layers 44 may have lattice constants closer to the lattice constant of channel layer 26, while the upper portions of buffer layers 44 may have lattice constants closer to the lattice constant of group-IV semiconductor regions 46. The lattice constant mismatches between buffer layers 44 and substrate 20, which may gradually increase from the bottom to the top of buffer layers 44.

In an exemplary embodiment, channel layer 26 is formed of $In_{0.7}Ga_{0.3}As$, while source/drain regions 42 are formed of germanium. The lattice constant of $In_{0.7}Ga_{0.3}As$ is greater than that of germanium, with the lattice constant mismatch between $In_{0.7}Ga_{0.3}As$ and germanium being about 4 percent. Accordingly, buffer layers 44 may have an indium percentage lower than 0.7. Buffer layers 44 may also be layers having a uniform composition, for example, $In_{0.2}Ga_{0.8}As$, or a gradient layer with an indium percentage gradually increasing from the bottom to the top.

Buffer layers 44 may be doped. If the resulting transistor is an NMOS transistor, the doped impurity may include silicon (Si). Conversely, if the resulting transistor is a PMOS transistor, the doped impurity may include zinc (Zn) and/or beryllium (Be).

It is observed that silicon/germanium in source/drain regions 42 may have a greater lattice mismatch with the III-V compound semiconductor material in channel layer 26. The greater lattice mismatch results in a high defect density and hence a high junction leakage. By forming buffer layers 44, the lattice mismatch between channel layer 26 and the adjoining source/drain regions 42 is reduced, resulting in a reduced junction leakage.

Figure 8A:
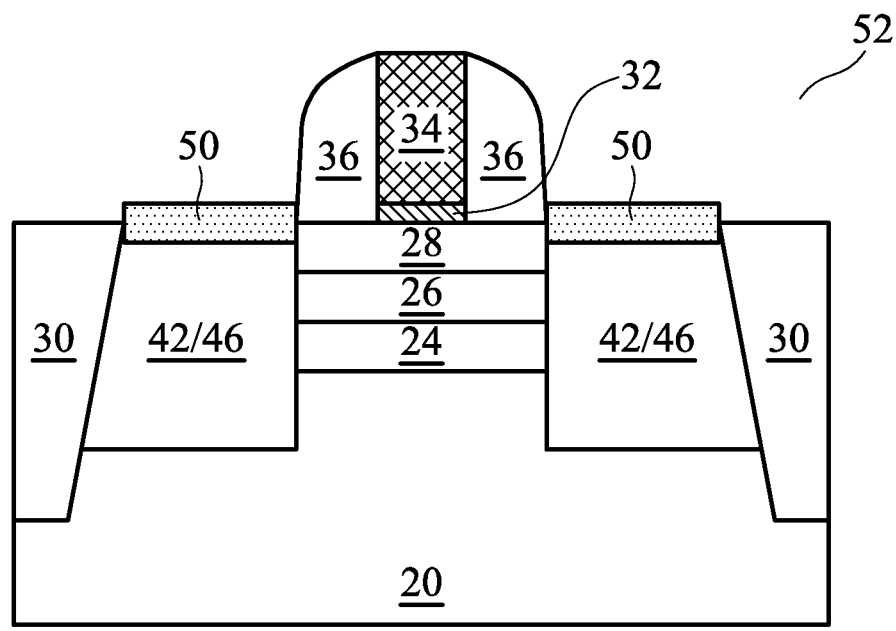
Figure 8B:
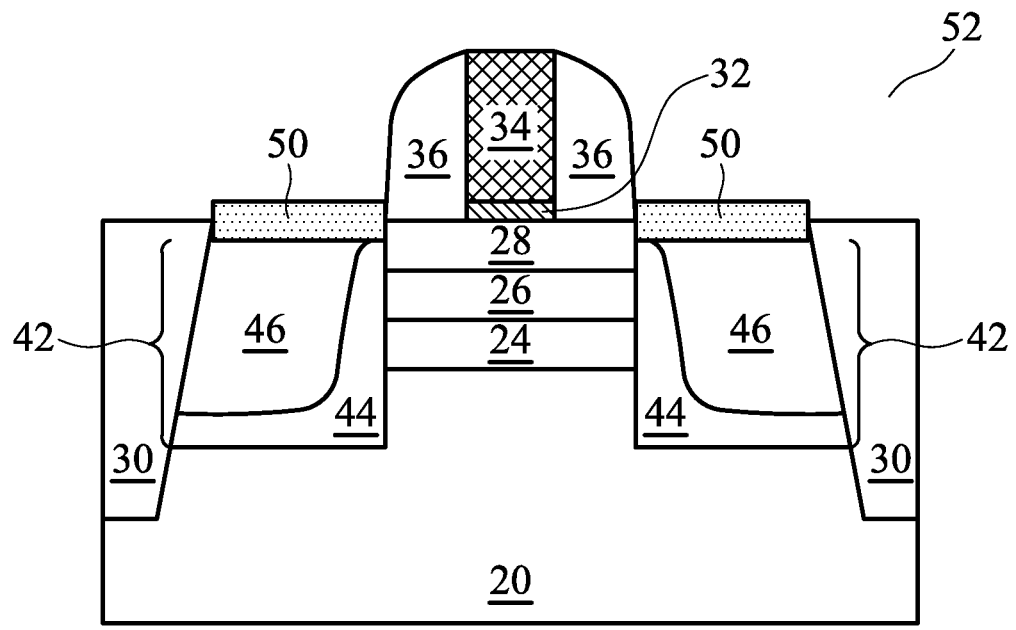

Next, as shown in FIGS. 8A and 8B, silicide regions 50 (which may also be, or comprise germanium silicide) are formed on source/drain regions 42. Since source/drain regions 42 comprise silicon and/or germanium, silicide can be formed by blanket forming a metal layer; performing an annealing to cause the metal layer to react with the underlying silicon and/or germanium; and removing un-reacted portions of the metal layer. Transistor 52 is thus formed.

Figure 9:
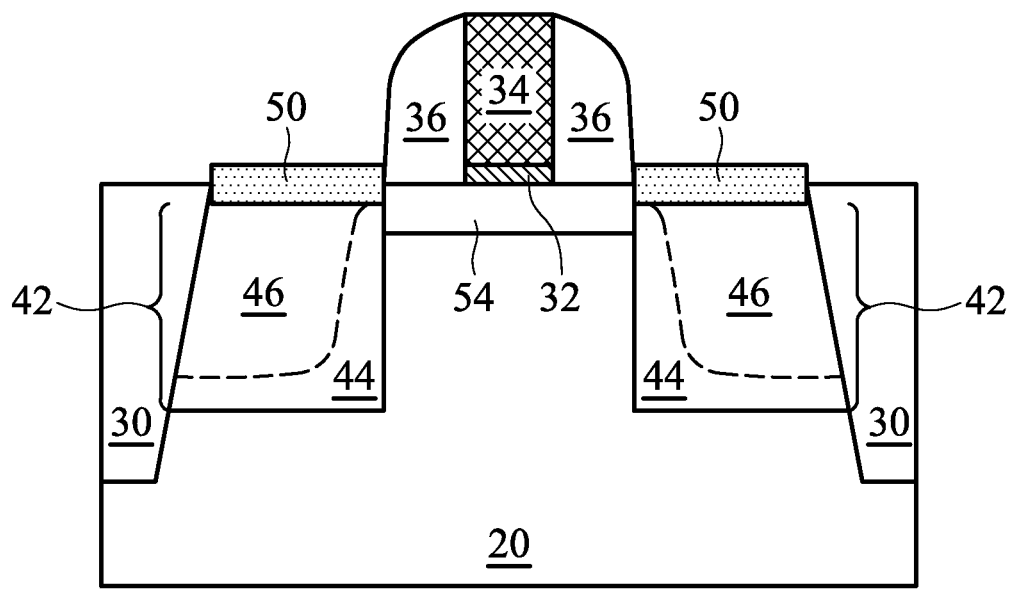

Referring to FIG. 9, the quantum well formed of bottom barrier 24, channel layer 26 and top barrier 28 may be replaced by channel layer 54. Channel layer 54 may be formed of a III-V compound semiconductor material, such as GaAs, InP, GaN, InGaAs, InAs, InSb, InAlAs, GaSb, AlSb, AlAs, AlP, GaP, and combinations thereof.

Figure 10:
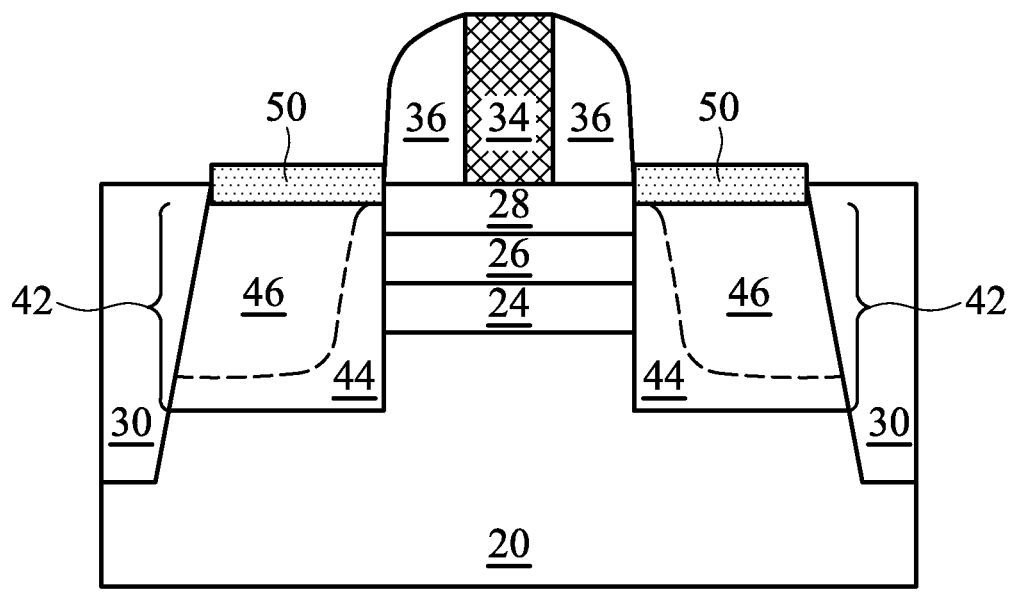

FIG. 10 illustrates an alternative embodiment, which is similar to the embodiment shown in FIGS. 8A and 8B, except no gate dielectric is formed. Gate electrode 34 directly contacts top barrier 28. In this case, the depletion region (not shown) resulting from the Schottky barrier between gate electrode 34 and top barrier 28 acts as the gate dielectric.

Figure 11:
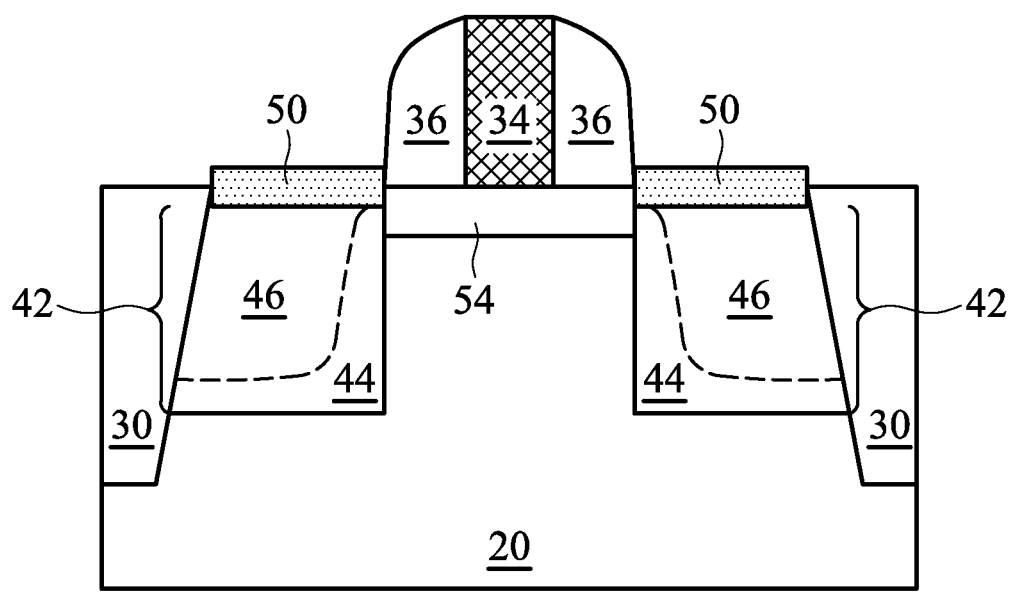

FIG. 11 illustrates a similar structure as shown in FIG. 9, wherein no gate dielectric is formed. Again, in FIGS. 9 through 11, source/drain regions 42 may include only doped silicon/germanium/SiGe regions that adjoin channel layer 26 (or 54), or doped silicon/germanium/SiGe regions and underlying buffer layers 44.

Figure 12:
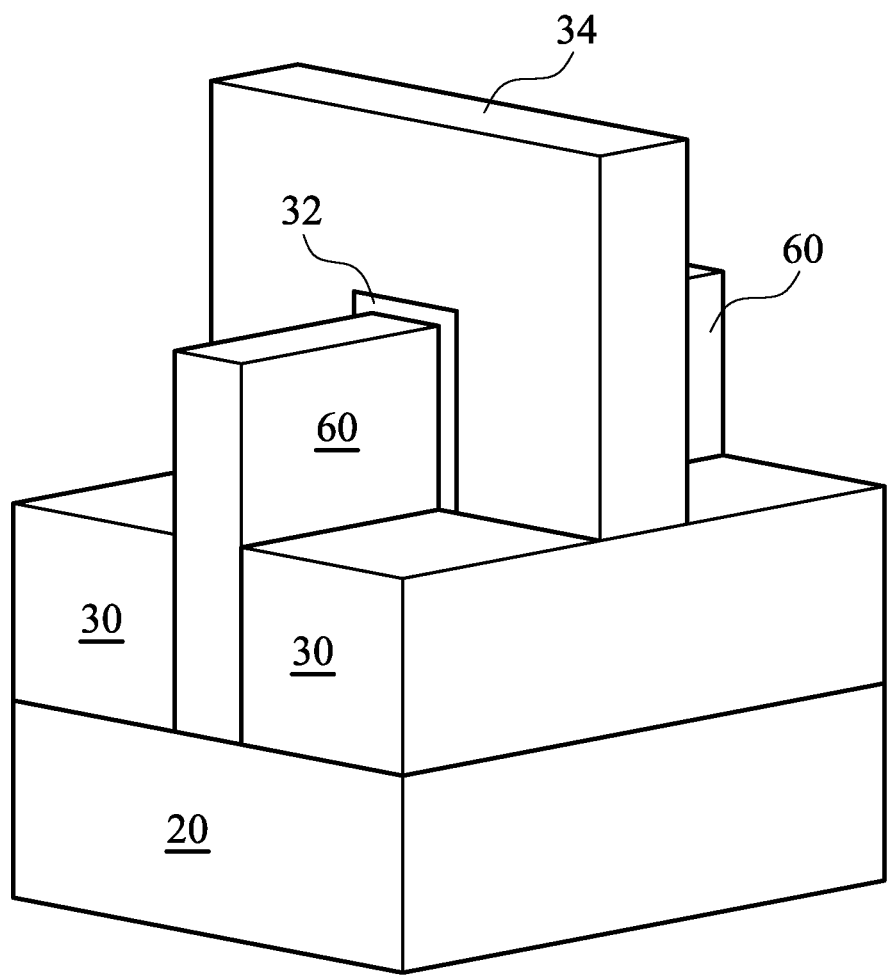
FIGS. 12 through 14 are perspective views of intermediate stages in the manufacturing of a fin field-effect transistor (FinFET) in accordance with an alternative embodiment.

The embodiments as discussed in the preceding paragraphs may be used on fin field-effect transistors (FinFETs). Referring to FIG. 12, fin 60, gate dielectric 32, gate electrode 34, and gate spacers 36 are formed (not shown). The formation details of fin 60 have been introduced in the co-pending U.S. Patent application: Application Ser. No. 61/182,550, filed May 29, 2009, and entitled "Gradient Ternary or Quaternary Multiple-Gate Transistor," which is incorporated herein by reference. Fin 60 may include a III-V compound semiconductor material.

Figure 13:
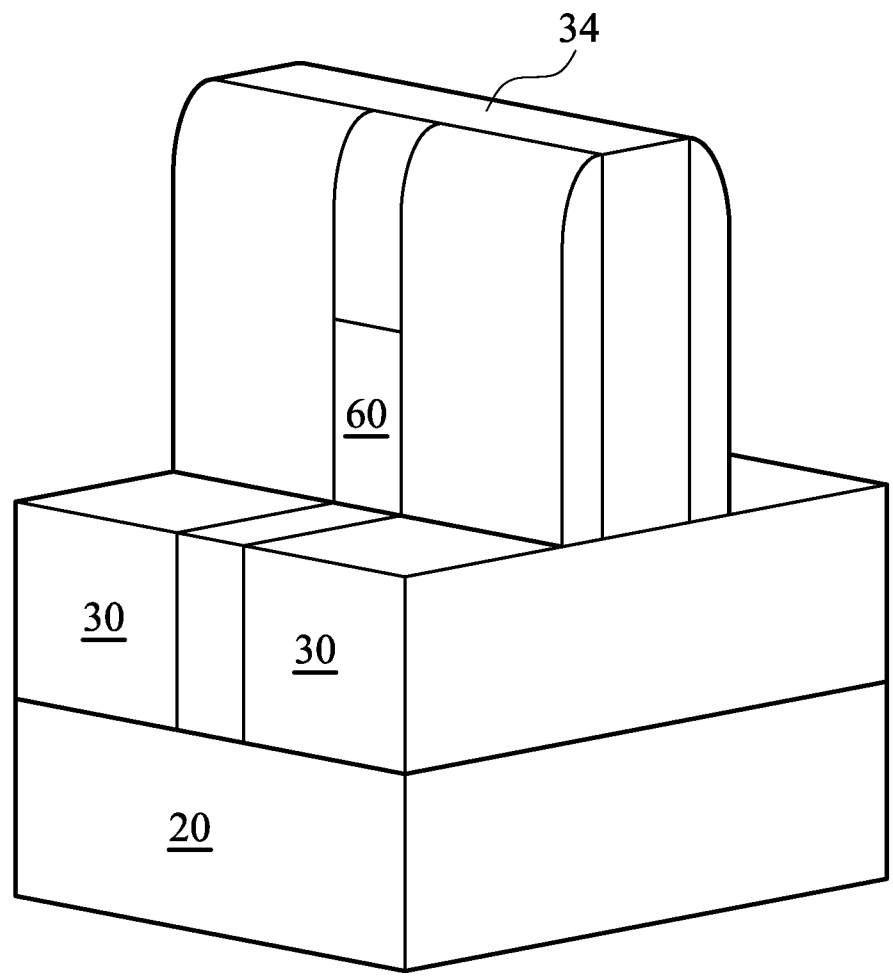
Figure 14:
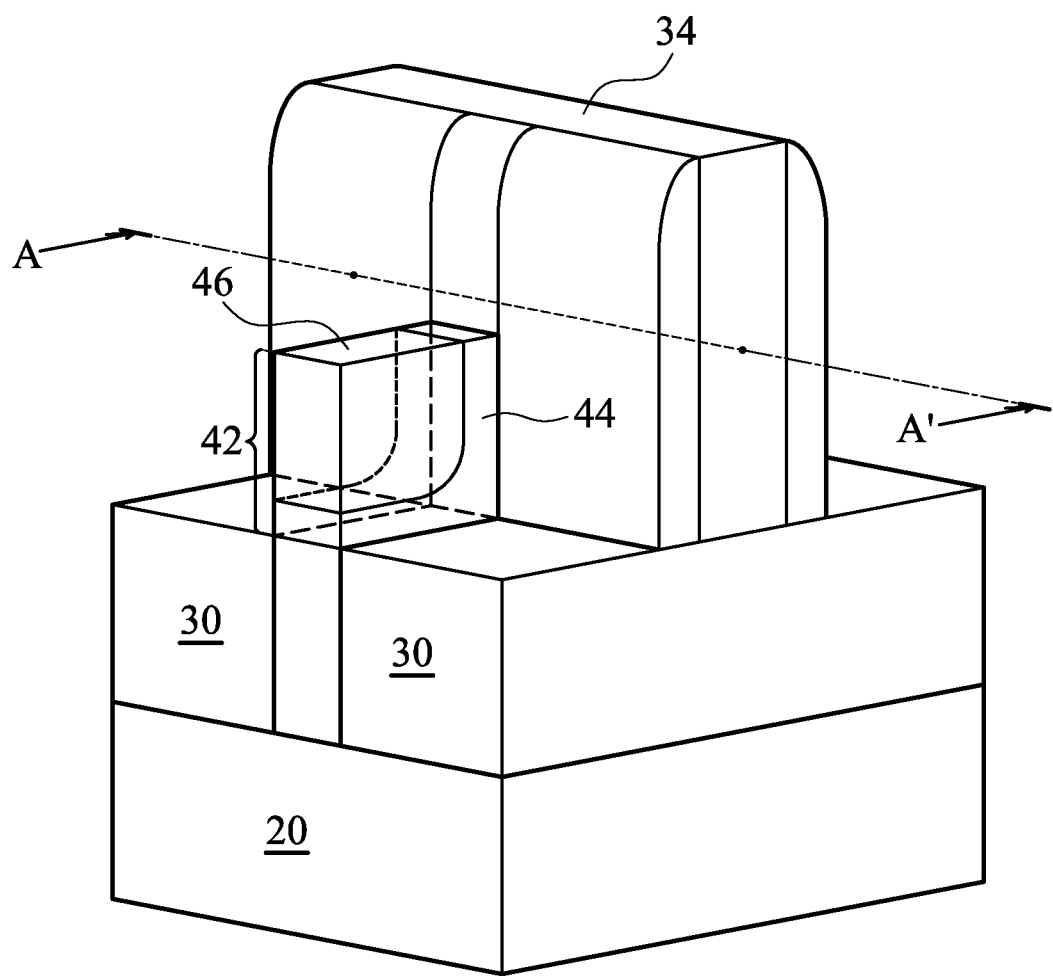

Next, as shown in FIG. 13, the exposed portions of fin 60 are removed. The portion of fin 60 covered by gate electrode 34 and gate spacers 36 is protected from been recessed. In FIG. 14, source/drain regions 42 are epitaxially grown and are formed of essentially the same materials as discussed in the preceding paragraphs. Again, source/drain regions 42 may include buffer layers 44 between group-IV semiconductor regions 46, or group-IV semiconductor regions only.

Figure 15:
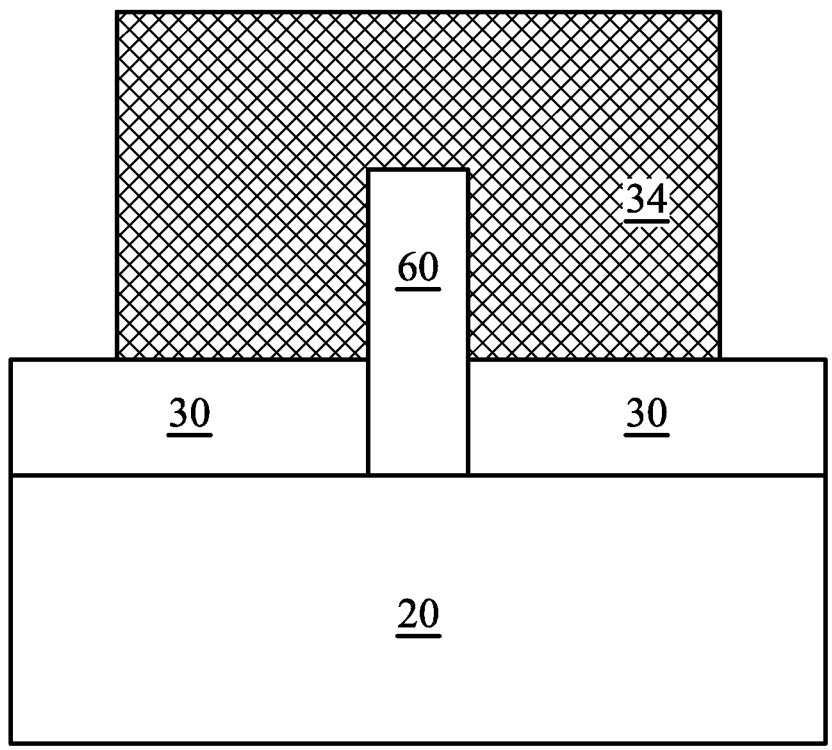
FIGS. 15 through 17 are cross-sectional views of FinFETs in accordance with embodiments of the present invention.
Figure 16:
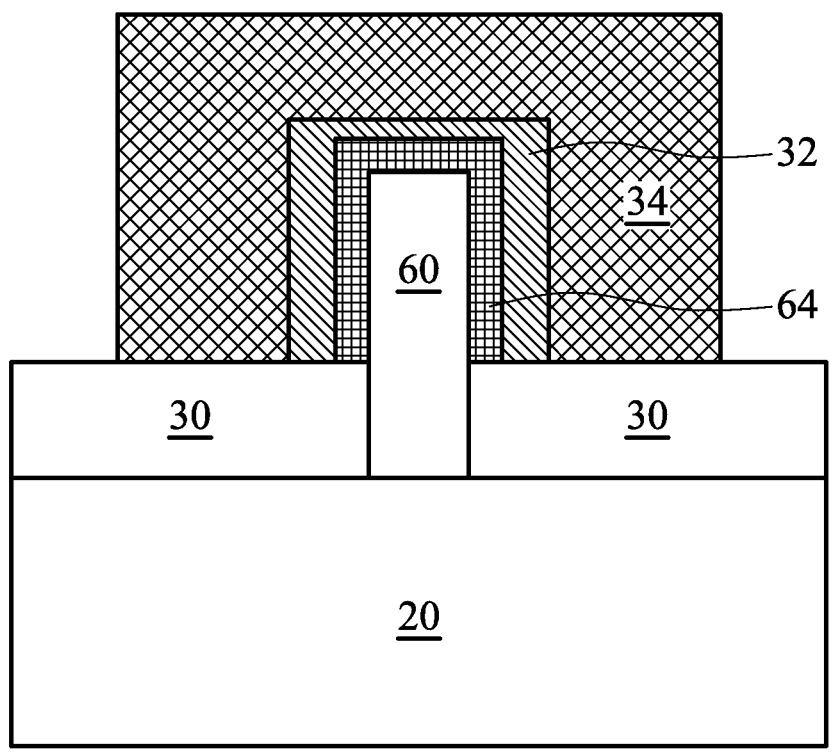
Figure 17:
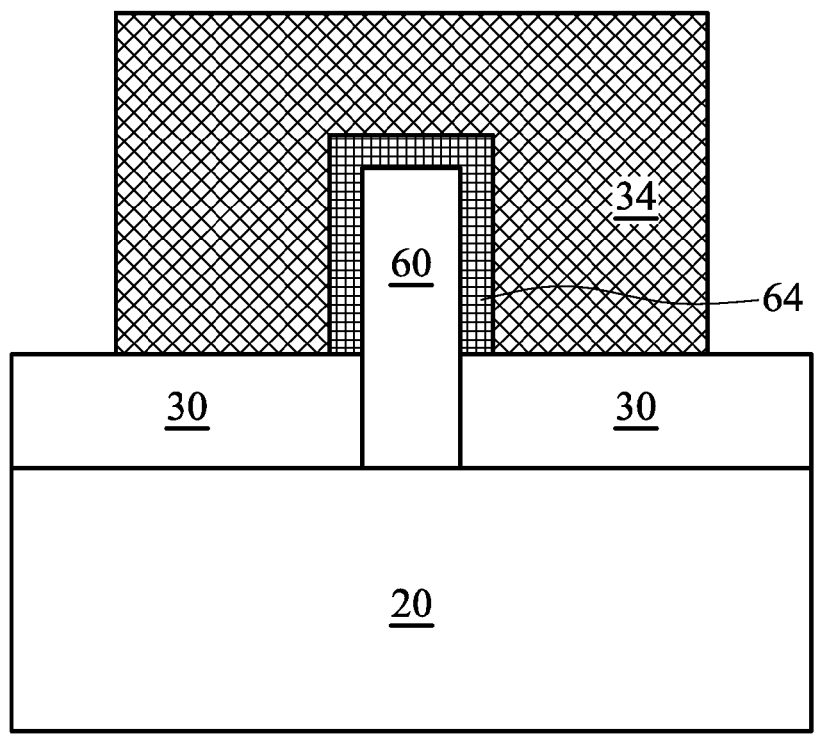

FIGS. 15-17 illustrate cross-sectional views of alternative embodiments, wherein the cross-sectional views are made in a vertical plane crossing line A-A' in FIG. 14. In FIG. 15, no gate dielectric is formed. Gate electrode 34 directly contacts fin 60. In this case, the depletion region (not shown) resulting from the Schottky barrier between gate electrode 34 and fin 60 acts as the gate dielectric.

Referring to FIG. 16, a quantum well is formed from fin 60 (referred to as a central fin hereinafter) and semiconductor layer 64 on the top surface and sidewalls of fin 60. Semiconductor layer 64 has a bandgap greater than a bandgap of fin 60, for example, by greater than about 0.1 eV. Again, the materials of fin 60 and semiconductor layer 64 are described by the incorporated U.S. Patent application: Application Ser. No. 61/182,550, filed May 29, 2009, and entitled "Gradient Ternary or Quaternary Multiple-Gate Transistor".

FIG. 17 illustrates a similar structure as shown in FIG. 15, wherein no gate dielectric is formed. Again, in FIGS. 15-17, although source/drain regions 42 are not shown in the cross-sectional view, they may be formed of essentially the same material as shown in FIG. 14.

The embodiments of the present invention have several advantageous features. By re-growing silicon/germanium source/drain regions 42, the existing silicidation technique can be used to reduce the source/drain resistance and to improve drive currents of the resulting transistors. Buffer layers 44 have the effect of smoothening the lattice constant transition between the channel of the transistor and the source/drain regions, resulting in a reduced defect density and reduced junction leakage currents.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a substrate;
   a channel over the substrate, wherein the channel comprises a first III-V compound semiconductor material formed of group III and group V elements;
   a gate structure over the channel; and
   a source/drain region adjacent the channel, wherein the source/drain region comprises:
      a group-IV region selected from the group consisting essentially of silicon, germanium, and combinations thereof; and
      a buffer layer between and adjoining the channel and the group-IV region,
   wherein the buffer layer comprises a second III-V compound semiconductor material.

2. The integrated circuit structure of claim 1 wherein a bottom surface of the source/drain region is lower than a bottom surface of the channel.

3. The integrated circuit structure of claim 1 further comprising a gate spacer on a sidewall of the gate structure, and wherein an outer edge of the gate spacer is vertically aligned to an inner sidewall of the source/drain region.

4. The integrated circuit structure of claim 1 further comprising a source/drain silicide region over and contacting the source/drain region.

5. The integrated circuit structure of claim 1, wherein the group-IV region is formed of a group-IV semiconductor material doped with an impurity, and wherein the second III-V compound semiconductor material having a lattice constant between a lattice constant of the channel and a lattice constant of the group-IV region.

6. The integrated circuit structure of claim 1, wherein the channel comprises:
   a bottom barrier;
   a channel layer over the bottom barrier; and
   a top barrier over the channel layer, wherein bandgaps of the bottom barrier and the top barrier are greater than a bandgap of the channel layer.

7. The integrated circuit structure of claim 1, wherein the gate structure comprises a gate electrode, and wherein an entirety of the gate electrode is over the channel.

8. The integrated circuit structure of claim 1, wherein the gate structure comprises a gate electrode, and wherein the gate electrode comprises a portion directly over the channel, and additional portions on opposite sides of the channel.

9. The integrated circuit structure of claim 1, wherein the gate structure comprises a gate dielectric and a gate electrode over the gate dielectric.

10. The integrated circuit structure of claim 1, wherein the gate structure comprises a gate electrode contacting an underlying semiconductor layer.

11. The integrated circuit structure of claim 1, wherein the buffer layer extends in a vertical direction lower than the channel and extends in a horizontal direction beneath substantially an entirety of the source/drain region.

12. The integrated circuit structure of claim 5, wherein the second III-V semiconductor material is doped with an element selected from the group consisting essentially of Si, Zn, Be, and combinations thereof.

13. An integrated circuit structure comprising:
   a semiconductor substrate;
   a channel over the semiconductor substrate, wherein the channel comprises a first III-V compound semiconductor material formed of group III and group V elements;
   a gate structure on the channel;
   a gate spacer on a sidewall of the gate structure;
   a recess adjoining the channel having a bottom lower than a bottom of the channel;
   a source/drain region in the recess, wherein the source/drain region comprises:
      a group-IV region formed of a semiconductor material selected from the group consisting essentially of silicon, germanium, and combinations thereof, wherein the source/drain region is doped with an n-type impurity or a p-type impurity; and
      a buffer layer comprising a second III-V compound semiconductor material in the recess, wherein the buffer layer comprises a vertical portion between the channel and the group-IV region.

14. The integrated circuit structure of claim 13 wherein the second III-V compound semiconductor material has a lattice constant between a first lattice constant of the channel and a second lattice constant of the group-IV region.

15. The integrated circuit structure of claim 14, wherein the buffer layer has a substantially uniform composition.

16. The integrated circuit structure of claim 14, wherein the buffer layer has a gradient composition, with first portions closer to the channel having lattice constants closer to the first lattice constant, and second portions closer to the group-IV region having lattice constants closer to the second lattice constant than the first portions.

17. The integrated circuit structure of claim 14, wherein the source/drain region is doped with an n-type impurity or a p-type impurity.

18. An integrated circuit structure comprising:
   a substrate;
   a fin over the substrate, wherein the fin comprises a channel comprising a first III-V compound semiconductor material formed of group III and group V elements;
   a gate structure comprising a portion directly over the fin, and additional portions on opposite sidewalls of the fin;
   a source/drain region adjoining the fin, wherein the source/drain region comprises a group-IV region formed of a semiconductor material selected from the group consisting essentially of silicon, germanium, and combinations thereof and; a buffer layer between and adjoining the channel and the source/drain region, wherein the buffer layer comprises a second III-V compound semiconductor material.

19. The integrated circuit structure of claim 18, wherein the fin comprises:
   a central fin formed of the first III-V compound semiconductor material; and
   a semiconductor layer comprising a first portion directly over the central fin, and a second portion on opposite sidewalls of the central fin, wherein the semiconductor layer has a greater bandgap than a bandgap of the central fin.

* * * * *

UNITED STATES PATENT AND TRADEMARK OFFICE
CERTIFICATE OF CORRECTION

| | | |
|---|---|---|
| PATENT NO. | : 8,816,391 B2 | Page 1 of 1 |
| APPLICATION NO. | : 12/615996 | |
| DATED | : August 26, 2014 | |
| INVENTOR(S) | : Ko et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 241 days.

Signed and Sealed this
Eleventh Day of August, 2015

Michelle K. Lee
*Director of the United States Patent and Trademark Office*